(12) United States Patent  (10) Patent No.: US 9,257,661 B2
Naya et al.  (45) Date of Patent: Feb. 9, 2016

(54) LIGHT EMITTING DEVICE

(75) Inventors: Masayuki Naya, Ashigarakami-gun (JP); Wataru Sotoyama, Ashigarakami-gun (JP); Hideki Yasuda, Ashigarakami-gun (JP)

(73) Assignee: UDC Ireland, Dublin (IE)

( * ) Notice: Subject to any disclaimer, the term of this patent is extended or adjusted under 35 U.S.C. 154(b) by 2 days.

(21) Appl. No.: 13/262,201

(22) PCT Filed: Mar. 29, 2010

(86) PCT No.: PCT/JP2010/002284
§ 371 (c)(1),
(2), (4) Date: Sep. 29, 2011

(87) PCT Pub. No.: WO2010/113467
PCT Pub. Date: Oct. 7, 2010

(65) Prior Publication Data
US 2012/0025184 A1  Feb. 2, 2012

(30) Foreign Application Priority Data
Mar. 30, 2009 (JP) .................. 2009-082789

(51) Int. Cl.
*H01L 51/50* (2006.01)
(52) U.S. Cl.
CPC ................... *H01L 51/5012* (2013.01)
(58) Field of Classification Search
CPC ...................................... H01L 51/52
USPC ............................ 257/40, E51.018
See application file for complete search history.

(56) References Cited

U.S. PATENT DOCUMENTS

| 4,885,211 A | 12/1989 | Tang |
| 2001/0005021 A1 | 6/2001 | Fukuyama et al. |
| 2004/0061108 A1 | 4/2004 | Fukuyama et al. |

(Continued)

FOREIGN PATENT DOCUMENTS

| EP | 0278757 | 8/1988 |
| EP | 0553950 | 8/1993 |

(Continued)

OTHER PUBLICATIONS

Organic Electronic: 04-2003-123-130; Tuning the performance of hybrid organic/inorganic quantum dot light-emitting devices: Coe-Sullivan, et al.

(Continued)

*Primary Examiner* — Matthew Reames
(74) *Attorney, Agent, or Firm* — Riverside Law LLP

(57) ABSTRACT

In an electroluminescence device, highly efficient light emission is realized without reducing the durability thereof. The electroluminescence device includes electrodes, a plurality of layers deposited between the electrodes, a light emitting region between the plurality of layers, the light emitting region emitting light by application of an electric field between the electrodes. The plurality of layers include a metal thin-film in the vicinity of the light emitting region. The metal thin-film induces plasmon resonance on the surface thereof by the emitted light. Surface modification is provided on at least one of the surfaces of the metal thin-film. The surface modification includes an end group having polarity that makes the work function of the metal thin-film become close to the work function of at least a layer next to the metal thin-film.

6 Claims, 3 Drawing Sheets

(56) References Cited

U.S. PATENT DOCUMENTS

| | | | |
|---|---|---|---|
| 2005/0035346 A1 | 2/2005 | Bazan et al. | |
| 2005/0194896 A1* | 9/2005 | Sugita et al. | 313/506 |
| 2007/0069199 A1 | 3/2007 | Choulis et al. | |
| 2007/0114523 A1 | 5/2007 | Oumi et al. | |
| 2007/0252126 A1 | 11/2007 | Kawakami et al. | |

FOREIGN PATENT DOCUMENTS

| | | | |
|---|---|---|---|
| EP | 1388903 | | 8/2002 |
| JP | 2001267081 A | | 9/2001 |
| JP | 2003217863 A | | 7/2003 |
| JP | 2006313667 A | | 11/2006 |
| JP | 2007103174 | | 4/2007 |
| JP | 2007165284 A | | 6/2007 |
| JP | 2009059584 | | 3/2009 |
| WO | 2005089288 A2 | | 9/2005 |
| WO | 2007039062 A1 | | 4/2007 |
| WO | WO2008140644 | * | 11/2008 |

OTHER PUBLICATIONS

Plasmonics: Metallic Nanostructures and Their Optical Properties VI, Proc. of SPIE vol. 7032, (2008); Emissive Efficiency Enhancement of Alq3 and Prospects for Plasmon-enhanced Organic Electroluminescence; Li, et al.

Langmuir 1999, 15, 1121-11277; American Chemical Society Jan. 9, 1999; Tuning the Work Function of Gold with Self-Assembled Monolayers Derived from X-[C6H4—C≡C-]nC6H4—SH(n=0, 1, 2; X=H, F, CH3, CF3 and OCH3); Zenner, et al.

Imaging Science and Engineering Lab., Tokyo Institute of Technology: Dec. 14, 2006; Enhancement of Positive Hold Injection to Liquid-Crystalline Semiconductor from Au Electrode Surface-Modified by Thiois: Toda; et al.

Applied Physics Letter; vol. 79, No. 2, Jul. 9, 2001; Fine tuning work function of indium tin oxide by surface molecular design: Enghanced hole injection in organic electroluminescent devices; Ganzorig, et al.

Wang, Ziyao et al. "Enhancement of top emission for organic light-emitting diode via scattering surface plasmons by nano-aggregated outcoupling layer" *Organic Electronics* 10 pp. 341-345 (2009).

* cited by examiner

LIGHT EMITTING DEVICE

TECHNICAL FIELD

The present invention relates to an electroluminescent light emitting device (electroluminescence device), which emits light by application of an electric field, and particularly to an electroluminescence device that can emit light with high efficiency.

BACKGROUND ART

Electroluminescence devices (EL devices), such as an organic EL device, an LED (light emitting diode), and a semiconductor laser, are structured in such a manner that electrode layers, a light emitting layer and the like are deposited (stacked, superposed or the like) one on another on a substrate. Generally, light generated in the light emitting layer is extracted through a transparent electrode. However, when light enters the interface of the light-extracting-side layer at an angle greater than or equal to a critical angle by influence of the refractive index of each layer, total reflection occurs. Therefore, the light is trapped in the electroluminescence device, and it is impossible to extract the light therefrom. Hence, highly efficient extraction of emitted light is difficult. For example, when the refractive index of the transparent electrode is the refractive index of ITO (indium-tin oxide) or the like, which is often used as the material of the transparent electrode, the light extraction efficiency is said to be approximately 20%.

For example, in an organic EL device, it is known that when an organic material is present in an excited state for a long period of time, the chemical bond of the organic material breaks inherently, and that the light emitting performance of the organic EL device deteriorates as time passes. It is essential to solve this problem when the organic material is used as the material of the electroluminescence device (light emitting device). Further, as long as fluorescence is used, light generation efficiency at an upper level (an upper energy level or state) is theoretically limited to 25%, and it is impossible to increase the light emitting efficiency more than this level. In principle, when phosphorescence is used and intersystem crossing is promoted, it is possible to induce the upper level including only triplets. Therefore, the theoretical limit may be increased to the range of 75% to 100%. However, the lifetime of the triplet in the upper level is longer than that of fluorescence, which is emitted in allowed transition, and the probability of collision between excitons is high. Therefore, the light emitting efficiency is lower. Further, the device deteriorates faster, and the durability of the device is low.

As described above, the extraction efficiency and the light emitting efficiency of the EL device are low. Therefore, the utilization efficiency of the emitted light is extremely low. Hence, the utilization efficiency needs to be improved.

As an approach to improving the light emitting efficiency (or enhancing light emission), W. Li et al., "Emissive Efficiency Enhancement of Alq$_3$ and Prospects for Plasmon-enhanced Organic Electroluminescence", Proc. of SPIE, Vol. 7032, pp. 703224-1-703224-7, 2008 (Non-Patent Document 1) proposes a method of utilizing a plasmon enhancement effect. In the method of utilizing the plasmon enhancement effect, metal (island form pattern is desirable) is arranged in the vicinity (for example, a few dozens of nanometers) of the light emitting layer to enhance the light emission. Plasmons (or localized plasmons) are induced on the surface of the metal by radiation of dipoles from the light emitting layer. After energy is absorbed, light is radiated again, and the newly emitted light enhances the light emission. Therefore, new transition to light emission by plasmons is added to the light emitting process of the light emitting device. Hence, the lifetime (excitation lifetime) in the upper level can be reduced. When the plasmon enhancement is utilized, improvement in the light emitting efficiency and improvement in durability by reduction of the excitation lifetime may be expected.

However, in Non-Patent Document 1, enhancement of light emission by the plasmon enhancement effect is confirmed only in a light-excitation-type light emitting device (photoluminescence device: PL device), and no successful example has been reported. Non-Patent Document 1 describes that insertion of a metal layer into the EL device causes charge trap and the flow of electrons and positive holes from the electrodes to the light emitting layer are inhibited. Further, Non-Patent Document 1 describes that the carrier balance is broken, and the light emission is suppressed rather than being enhanced.

DISCLOSURE OF INVENTION

In view of the foregoing circumstances, it is an object of the present invention to provide an EL device that can achieve high light emitting efficiency without lowering the durability of the device.

An electroluminescence device of the present invention is an electroluminescence device comprising:

electrodes;

a plurality of layers that are deposited one on another between the electrodes; and a light emitting region between the plurality of layers, the light emitting region emitting light by application of an electric field between the electrodes, wherein the plurality of layers include a metal thin-film arranged in the vicinity of the light emitting region, the metal thin-film inducing plasmon resonance on the surface thereof by the light emitted from the light emitting region, and wherein surface modification is provided on at least one of the surfaces of the metal thin-film, the surface modification including an end group having polarity that makes the work function of the metal thin-film become close to the work function of at least a layer next to the metal thin-film.

Here, the term "electroluminescence device" is used as a general term for a device that emits light by application of an electric field. The electroluminescence device includes an organic EL device, an inorganic EL device, a light emitting diode (LED), and a semiconductor laser (LD: laser diode).

It is desirable that the main component of the metal thin-film is Au or Ag. Here, the term "main component" is defined as a component the content of which is greater than or equal to 80 weight percent (wt %).

The metal thin-film may be a metal thin-film that spreads without interruption or a gap (hereinafter, referred to as a solid metal thin-film). Alternatively, the metal thin-film may have an uneven pattern of projections and depressions that is smaller than the wavelength of the light emitted from the light emitting region. The metal thin-film having the uneven pattern that is smaller than the wavelength of the emitted light maybe an island-pattern thin-film in which a plurality of metal microparticles are dispersed in layer form. Alternatively, the metal thin-film may include a metal layer formed by pattern formation using metal. It is desirable that the metal thin-film is a thin-film having island pattern in which metal microparticles having particle diameters of greater than or equal to 5 nm are dispersed, in layer form, randomly or in periodic arrangement pattern. Here, the particle diameter of the microparticle refers to the longest length of the microparticle. Specifically, when the microparticle is a sphere, the diameter of the sphere is the particle diameter of the microparticle. When the microparticle is in rod form, the major axis of the rod is the particle diameter of the microparticle.

It is desirable that a distance between the metal thin-film and the light emitting region is less than or equal to 30 nm.

In the electroluminescence device of the present invention, surface modification including an end group having a polarity that makes the work function of the metal thin-film become close to the work function of at least a layer next to the metal thin-film is provided. Therefore, when the work function of the metal thin-film is less than the work functions of layers next to the metal thin-film on either side of the metal thin-film (cathode side), the end group is an electron donor group. When the work function of the metal thin-film is greater than the work functions of layers next to the metal thin-film on either side of the metal thin-film (anode side), the end group is an electron withdrawing group.

When the electroluminescence device is an organic EL device, it is desirable that the plurality of layers include at least an electron transport layer, a light emitting layer, and a positive-hole transport layer, and each of which is formed of an organic layer. When the electroluminescence device is structured in such a manner, it is desirable that the metal thin-film is formed on the surface of the positive-hole transport layer or the electron transport layer, or in the positive-hole transport layer or the electron transport layer.

When the electroluminescence device is an LED or an LD, it is desirable that the plurality of layers include at least a p-type clad layer, an active layer, and an n-type clad layer, and each of which is formed of a semiconductor layer.

In an organic LED, formation of surface modification on metal by using SAM (self-assembled monolayer) including an electron donor group to adjust the work function of a metal electrode with respect to an organic polymer that forms Schottky barrier with the metal electrode is described in R. W. Zehner et al., "Tuning the Work Function of Gold with Self-Assembled Monolayers Derived from X—[$C_6H_4$—C≡C—]$_n$$C_6H_4$—SH (n=0, 1, 2; X=H, F, $CH_3$, $CF_3$, and $OCH_3$)", Langmuir, 1999, Vol. 15, pp. 1121-1127. Further, Toru Toda, et al., "Enhancement of Positive Hole Injection to Liquid-Crystalline Semiconductor from Au Electrode Surface-Modified by Thiols", Journal of the Society of Photographic Science and Technology of Japan, 70, No. 1, pp. 38-43, 2007 describes controlling the flow of electrons by providing surface modification on metal by using an electron donor group or an electron withdrawing group to adjust the energy level of gold or silver.

Therefore, if only the energy level of the metal thin-film is adjusted, the technique disclosed in the above documents may be applied to the metal thin-film. However, if the technique is simply applied, there is a possibility that the improvement of the light emitting efficiency by plasmon resonance is prevented. In this circumstance, the inventors of the present invention have conceived of a structure that can adjust the energy level of the metal thin-film while the improvement of the light emitting efficiency by plasmon resonance is sufficiently utilized. Further, an electroluminescence device that can achieve high light emitting efficiency without reducing the durability of the device has been obtained.

The electroluminescence device of the present invention includes a metal thin-film in the vicinity of a light emitting region, and the metal thin-film induces plasmon resonance on the surface thereof by light emitted from the light emitting region. Further, surface modification including an end group having a polarity that makes the work function of the metal thin-film become close to the work function of at least a layer next to the metal thin-film is provided on at least one of the surfaces of the metal thin-film. In such a structure, since the work function of the metal thin-film is close to the work function of a layer or layers next to the metal thin-film, the flow of electrons and positive holes are not prevented by charge trap. Further, transition to light emission by plasmons can enhance light emission and reduce the lifetime (excitation lifetime) in the upper level. Consequently, it is possible to greatly improve the light emitting efficiency and the durability of the device by reduction of the excitation lifetime.

BEST MODE FOR CARRYING OUT THE INVENTION

<Electroluminescence (EL) Device>

Figure 1:
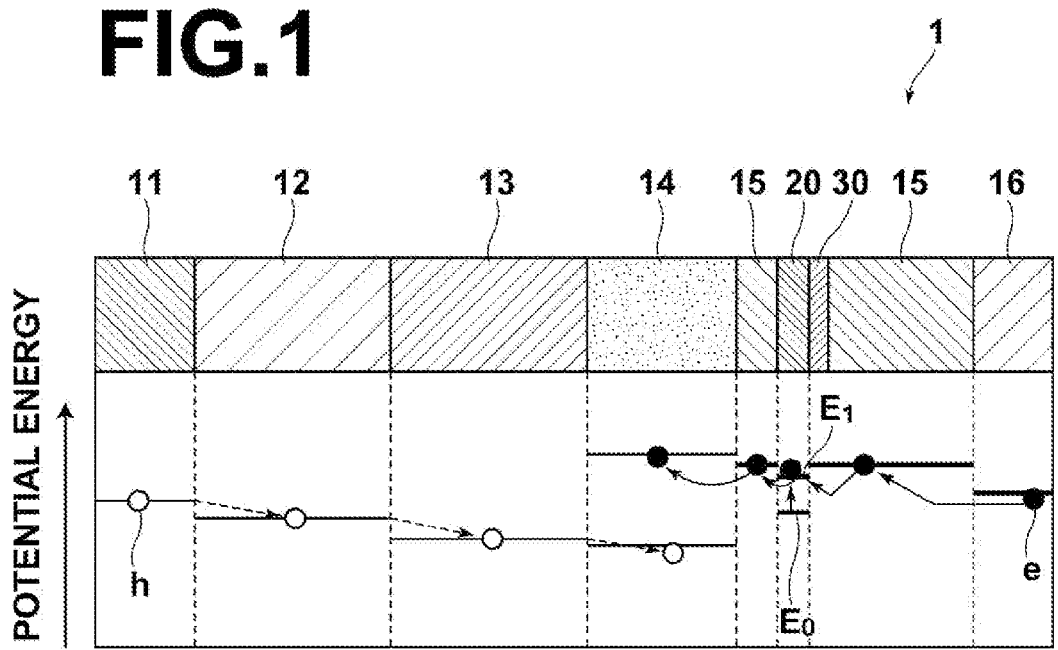
FIG. 1 is a schematic diagram illustrating the structure of layers in an EL device according to a first embodiment of the present invention and the potential energy of each of the layers.

With reference to drawings, an electroluminescence device (EL device) according to embodiments of the present invention will be described. FIG. 1 is a schematic cross-sectional diagram illustrating the structure of an EL device according to the present embodiment. In FIG. 1, elements are appropriately illustrated at different scales from actual sizes so that the elements are easily recognized. In FIG. 1, the potential energy of each layer is also illustrated.

As illustrated in FIG. 1, an electroluminescence device (EL device) 1 includes, from the left side of FIG. 1, an anode (positive electrode) 11, a positive hole injection layer 12, a positive hole transport layer 13, a light emitting layer (light emitting region) 14, an electron transport layer 15, and a cathode (negative electrode) 16. Further, a metal thin-film 20 is provided in the electron transport layer 15. Further, a work function adjustment layer (surface modification) 30 is provided on a surface of the metal thin-film 20.

The light emitting layer 14 is not particularly limited as long as the layer is adoptable as a light emitting layer of an organic EL device. For example, Alq3(tris(8-quinolinolato)-aluminum) or the like maybe used. The organic EL device 1 emits light when electrons and positive holes, which are injected from the anode 11 and the cathode 17 respectively, recombine with each other in this region.

The metal thin-film 20 is arranged in the vicinity of the light emitting region (light emitting layer 14), in which plasmon resonance is inducible by the emitted light. The thickness of the metal thin-film 20 is not particularly limited as long as the plasmon resonance is inducible. However, it is desirable that the thickness of the metal thin-film is thinner, because it is desirable that the metal thin-film is not completely reflective.

When the metal thin-film 20 is in contact with the light emitting layer 14 or located in the vicinity of less than 5 nm from the light emitting layer 14, the probability that electric charges are directly moved from the light emitting layer 14 and the light emission attenuates is high. Therefore, it is desirable that the light emitting layer 14 and the metal thin-film 20 are apart from each other at least by 5 nm. However, if the distance between the metal thin-film 20 and the light emitting layer 14 is too long, it becomes difficult to induce plasmon resonance by the emitted light. Therefore, it is impossible to enhance light emission. Hence, it is desirable that distance d between the metal thin-film 20 and the light emitting layer 14 is less than or equal to 30 nm.

The metal thin-film 20 may be a flat thin-film or layer without interruption (a solid thin-film that spreads without interruption). However, it is desirable that the metal thin-film 20 has an uneven pattern (projections and recesses) that is smaller than the wavelength of emitted light. Examples of a thin-film having an uneven pattern that is smaller than the wavelength of emitted light are an island pattern thin-film, a metal thin-film including a metal layer formed by pattern formation using metal and the like, which have interruption, a gap, a cavity or the like. An island pattern in which metal microparticles having particle diameters greater than or equal to 5 nm are dispersed, in layer form, randomly or periodically is desirable.

When the metal thin-film is a flat thin-film, surface plasmons are induced on the surface of the metal thin-film by emitted light. However, recombination for radiation mode does not tend to occur, and as non-radiation process, the ratio of plasmons that finally disappear as heat is high. In contrast, when the metal thin-film is an island pattern thin-film, the surface plasmons induced on the surface of the metal thin-film by the emitted light are recombined for radiation mode, and the efficiency of outputting radiation light is high.

As the material of the metal thin-film 20, a material that induces plasmon resonance by emitted light should be used. For example, Ag (silver), Au (gold), Cu (copper), Al (aluminum) or an alloy containing one of these metals as a main component (greater than or equal to 80%) may be used. When the emitted light has a wavelength in the visible light range, silver is desirable, because silver can induce surface plasmon resonance in the visible light range because of the plasma frequency. When the wavelength of the emitted light is not in the visible light range, for example, if the wavelength of the emitted light is in an infrared ray range, it is desirable that the material is gold.

The work function adjustment layer 30 is a surface modification layer including an end group that makes the work function of the metal thin-film 20 become close to the work function of a layer (the electron transport layer 15 in this case) next to the metal thin-film 20. The metal thin-film 20 is arranged in a region in which plasmon resonance is inducible by the light emitted from the light emitting layer 14.

Figure 2A:
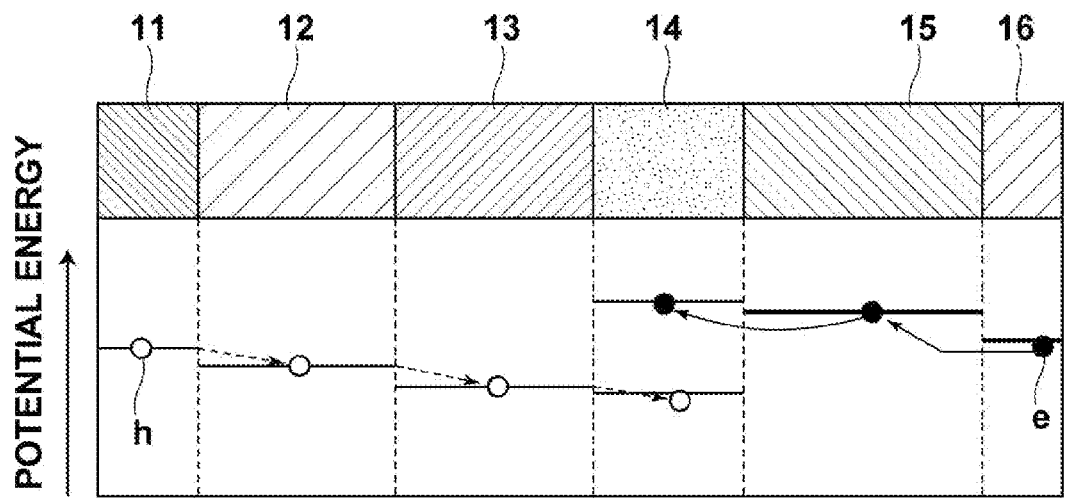
FIG. 2A is a schematic diagram illustrating the structure of layers in a general EL device and the potential energy of each of the layers.

FIG. 2A is a schematic cross-sectional diagram illustrating the structure of a general organic EL device. In a manner similar to FIG. 1, the potential energy of each layer is also illustrated. In FIG. 2A, black circles represent electrons e, and white circles represent holes (positive holes) h.

As illustrated in FIG. 2A, generally, each layer of an EL device is arranged in such a manner that the work function of each layer continuously changes and gradually decreases or increases from the anode 11 side and the cathode 16 side toward the light emitting layer 14.

Figure 2B:
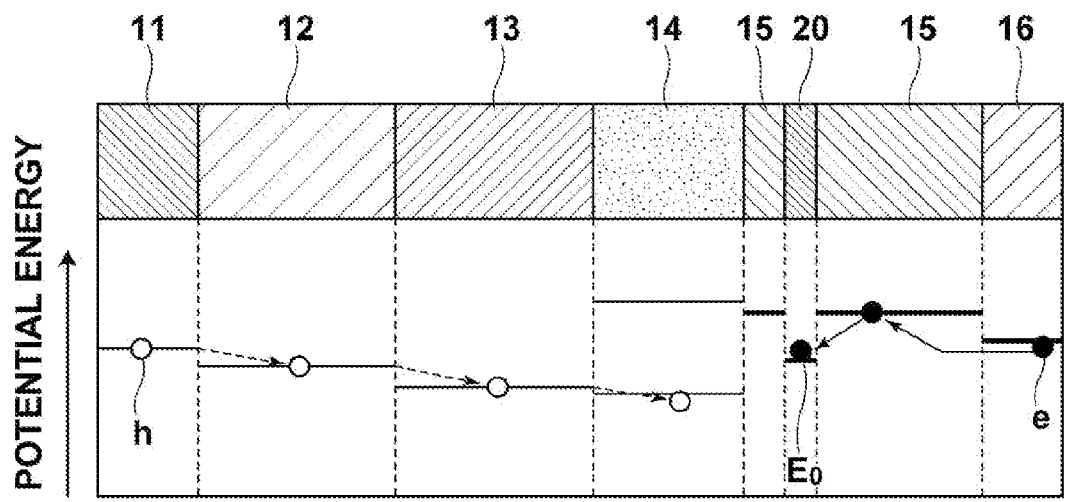
FIG. 2B is a schematic diagram illustrating the structure of layers in an EL device including a metal thin-film in the layers and the potential energy of each of the layers.

As described in the section, "Background Art" of this specification, it has been confirmed in a photoluminescence device that when metal (island pattern is desirable) is arranged in the vicinity (for example, a few dozens of nanometers) of the light emitting layer of the organic light emitting device, dipole radiation from the light emitting layer induces plasmons (or localized plasmons) on the surface of the metal. After energy is absorbed, new emission of light by re-radiation is added, thereby improving the light emitting efficiency. Further, it has been confirmed that the durability is improved by reduction of the excitation lifetime. However, when the organic EL structure is structured in a similar manner (FIG. 2B), the work function of the metal thin-film 20, inserted in the electron transport layer 15 as illustrated in FIG. 2B, is higher than the work function of the electron transport layer 15, and electrons are trapped in the metal thin-film 20 during application of an electric field. Therefore, the flow of electrons is prevented, and the carrier balance is broken. Therefore, the recombination efficiency at the light emitting layer 14 becomes lower, and the light emission is suppressed rather than being enhanced.

The organic EL device 1 of the present embodiment includes a work function adjustment layer (surface modification) 30 on the surface of the metal thin-film 20. The work function adjustment layer 30 adjusts the work function of the metal thin-film 20 so that the work function of the metal thin-film 20 becomes close to the work function of the electron transport layer 15.

The work function adjustment layer 30 has a function of suppressing or preventing electron trap by the metal thin-film 20. The work function adjustment layer 30 lowers the effective work function of the metal thin-film 20. In other words, the work function adjustment layer 30 changes ordinary energy level $E_0$ of the metal thin-film 20 to effective energy level $E_1$, thereby preventing the metal thin-film 20 from trapping electrons e. Consequently, the electrons e are moved to the light emitting layer side (please refer to FIG. 1).

Figure 3:
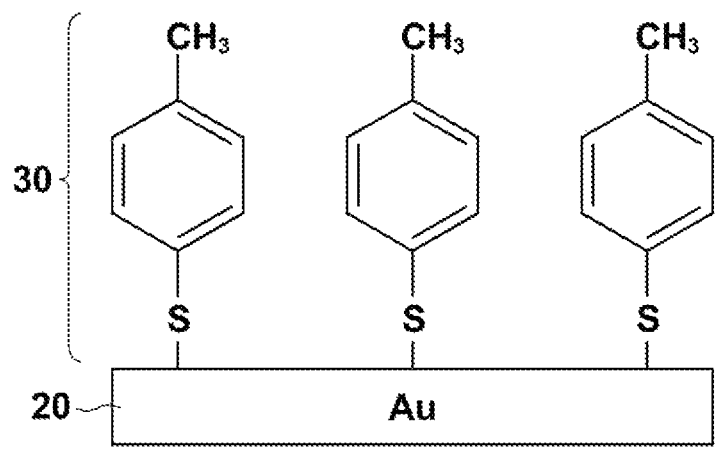
FIG. 3 is a diagram for explaining a work function adjustment layer of the EL device illustrated in FIG. 1.

FIG. 3 is a diagram illustrating an example of the work function adjustment layer 30. In this example, the metal thin-film 20 is made of Au. As illustrated in FIG. 3, the work function adjustment layer 30 is a SAM (self-assembled monolayer) formed on the surface of the thin-film of Au. The SAM binds to the surface of the thin-film of Au by the reaction of thiol or disulfide, which has an end group having a polarity, with Au. In the example illustrated in FIG. 3, the SAM is made of benzenethiol (thiophenol), which has a methyl group at a para position of a thiol group.

An alkyl group, such as the methyl group, is an electron donor group. When such an end group is included, the electron donor characteristics of the electron donor group increase the potential energy of Au, and lower the work function of Au. Examples of the electron donor group are an alkyl group, such as a methyl group, an amino group, a hydroxyl group, and the like.

After a Au thin-film is formed, the work function adjustment layer 30 may be formed on the Au thin-film by using a general method for producing SAM. It is desirable to use a liquid phase method, such as an application (coating) method, a vapor deposition method, or a sputter method. The work function adjustment layer 30 may be provided on a surface of the metal thin-film 20 or on both surfaces of the metal thin-film 20.

Here, a case of inserting the metal thin-film 20 in the electron transport layer 15 has been described. Alternatively, the metal thin-film 20 may be inserted in the positive hole transport layer 13 on the anode side. In that case, the work function of the metal thin-film 20 is lower than the work function of the positive hole transport layer 13 (potential energy is higher). Therefore, it is sufficient if the work function adjustment layer 30 is provided only on a surface of the metal thin-film 20 to lower the potential energy of the metal thin-film 20 and to make the work function of the metal thin-film 20 become close to the work function of the positive hole transport layer 13. In this case, the work function adjustment layer 30 may include an electron withdrawing group instead of the electron donor group illustrated in FIG. 3. When the electron withdrawing group is included in the work function adjustment layer 30, the work function adjustment layer 30 lowers the effective potential energy of the metal thin-film 20 so that the work function of the metal thin-film 20 become close to the work function of the positive hole transport layer 13. Examples of the electron withdrawing group are a nitro group, a carboxyl group, a sulfo group, and the like.

The inventors of the present invention have found that the structure as described above can adjust the energy level of the metal thin-film while the improvement of the light emitting efficiency by plasmon resonance is sufficiently utilized.

The organic EL device 1 includes the metal thin-film 20 in the vicinity of the light emitting layer (light emitting region) 14. The metal thin-film 20 induces plasmon resonance on the surface of the metal thin-film 20 by light emitted from the light emitting region 14. Further, surface modification is provided on at least one of the surfaces of the metal thin-film 20. The surface modification includes an end group having a polarity that can make the work function of the metal thin-film 20 close to the work function of at least a layer next to the metal thin-film 20. When the organic EL device 1 is structured in such a manner, the work function of the metal thin-film 20 is close to the work function of a layer next to the metal thin-film 20. Therefore, it is possible to enhance light emission and to reduce the lifetime (excitation lifetime) in the upper level by transition to light emission by plasmons without preventing the flow of electrons and positive holes by charge trap. Accordingly, it is possible to greatly improve the light emission efficiency and the durability by reduction of the excitation lifetime.

In the EL device as described above, layers are sequentially deposited on the substrate from the anode side, and the light can be extracted from the anode side, for example. Layers other than the metal thin-film may be formed by using materials and deposition methods that are used in conventional organic EL devices. Further, the metal thin-film (island pattern thin-film) may be formed, for example, by performing annealing after deposition by sputtering, or by performing oblique vapor deposition, or the like.

In the above embodiments, each of the cathode, the electron injection layer, the electron transport layer, the light emitting layer, the positive hole transport layer, the positive hole injection layer, the anode, and the like may be made of materials selected from various well-known materials, each having an appropriate function. Further, a positive hole block layer, an electron block layer, a protective layer or the like may be provided.

Further, in each of the embodiments, the present invention has been described with respect to an organic EL device, in which a plurality of layers including the light emitting layer are organic compound layers. Alternatively, the EL device of the present invention may be applied to an inorganic EL device, in which the plurality of layers including the light emitting layer are inorganic compound layers. Further, the EL device of the present invention may be applied to a light emitting diode including a plurality of semiconductor layers and a semiconductor laser.

Further, the EL device of the present invention may be appropriately applied to a display device or element, a display, a back light, an electronic photograph, a light source for lighting, a light source for recording, a light source for exposure, a light source for readout, a sign or mark, a signboard, an interior decoration or object, optical communication, and the like.

The invention claimed is:

1. An electroluminescence device comprising:
   electrodes;
   a plurality of layers that are deposited one on another between the electrodes; and
   a light emitting region between the plurality of layers, the light emitting region emitting light by application of an electric field between the electrodes,
   wherein the plurality of layers include a solid metal thin-film which spreads without interruption that is arranged in the vicinity of the light emitting region, the metal thin-film inducing plasmon resonance on the surface thereof by the light emitted from the light emitting region, and
   wherein surface modification is provided on at least one of the surfaces of the metal thin-film,
   wherein the surface modification is selected from the group consisting of:
      the surfaces of the metal thin film are modified with an electron donor end group so that the work function of the metal thin-film is less than the work functions of layers next to the metal thin-film; and
      the surfaces of the metal thin film are modified with an electron withdrawing end group so that the work function of the metal thin-film is greater than the work functions of layers next to the metal thin-film.

2. An electroluminescence device, as defined in claim 1, wherein the main component of the metal thin-film is Au or Ag.

3. An electroluminescence device, as defined in claim 1, wherein a distance between the metal thin-film and the light emitting region is less than or equal to 30 nm.

4. An electroluminescence device, as defined in claim 1, wherein the plurality of layers include at least an electron transport layer, a light emitting layer, and a positive-hole transport layer, and each of which is formed of an organic layer.

5. An electroluminescence device, as defined in claim 4, wherein the metal thin-film is formed on the surface of the electron transport layer or in the electron transport layer.

6. An electroluminescence device, as defined in claim 4, wherein the metal thin-film is formed on the surface of the positive-hole transport layer or in the positive-hole transport layer.

* * * * *